United States Patent
Sakamoto et al.

(10) Patent No.: US 11,387,173 B2
(45) Date of Patent: Jul. 12, 2022

(54) METHOD FOR MANUFACTURING SEMICONDUCTOR DEVICE

(71) Applicant: Mitsubishi Electric Corporation, Tokyo (JP)

(72) Inventors: Ken Sakamoto, Tokyo (JP); Taketoshi Shikano, Tokyo (JP); Hiroshi Kawashima, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 361 days.

(21) Appl. No.: 16/686,971

(22) Filed: Nov. 18, 2019

(65) Prior Publication Data

US 2020/0091047 A1     Mar. 19, 2020

Related U.S. Application Data

(62) Division of application No. 15/322,191, filed as application No. PCT/JP2014/076571 on Oct. 3, 2014, now Pat. No. 10,541,193.

(51) Int. Cl.
*H01L 23/495* (2006.01)
*H01L 23/00* (2006.01)
(Continued)

(52) U.S. Cl.
CPC .... *H01L 23/49517* (2013.01); *H01L 21/4842* (2013.01); *H01L 21/56* (2013.01);
(Continued)

(58) Field of Classification Search
CPC ......... H01L 23/49517; H01L 23/49565; H01L 23/3107; H01L 23/49541; H01L 21/565; H01L 24/97

See application file for complete search history.

(56) References Cited

U.S. PATENT DOCUMENTS 5,841,187 A   11/1998 Sugimoto et al.
5,903,068 A    5/1999 Suzuki
(Continued)

FOREIGN PATENT DOCUMENTS

CN            1337743 A     2/2002
DE   10 2005 043 928 A1    6/2006
(Continued)

OTHER PUBLICATIONS

An Office Action mailed by the German Patent Office dated May 14, 2020, which corresponds to German Patent Application No. 11 2014 007 018.1. and is related to U.S. Appl. No. 16/686,971; with English language translation.
(Continued)

*Primary Examiner* — Sophia T Nguyen
*Assistant Examiner* — Scott E Bauman
(74) *Attorney, Agent, or Firm* — Studebaker & Brackett PC (57) ABSTRACT

A first lead terminal, a second lead terminal provided parallel to the first lead terminal, and a tie bar connecting the first lead terminal and the second lead terminal are provided. The tie bar includes a first narrow-width section touching the first lead terminal, a second narrow-width section touching the second lead terminal, and a wide-width section having a larger width than the first narrow-width section and the second narrow-width section and connecting the first narrow-width section and the second narrow-width section. The wide-width section has a through-hole formed between the first narrow-width section and the second narrow-width section.

4 Claims, 8 Drawing Sheets

(51) Int. Cl.
*H01L 21/48* (2006.01)
*H01L 21/56* (2006.01)
*H01L 23/31* (2006.01)

(52) U.S. Cl.
CPC ...... *H01L 21/565* (2013.01); *H01L 23/49565* (2013.01); *H01L 24/97* (2013.01); *H01L 23/3107* (2013.01); *H01L 23/49541* (2013.01); *H01L 2224/04042* (2013.01); *H01L 2224/32245* (2013.01); *H01L 2224/48091* (2013.01); *H01L 2224/48137* (2013.01); *H01L 2224/48139* (2013.01); *H01L 2224/48247* (2013.01); *H01L 2224/48472* (2013.01); *H01L 2224/4903* (2013.01); *H01L 2224/73265* (2013.01); *H01L 2224/92247* (2013.01); *H01L 2224/97* (2013.01); *H01L 2924/181* (2013.01)

(56) References Cited

U.S. PATENT DOCUMENTS

| | | | |
|---|---|---|---|
| 6,097,828 A | 8/2000 | Suzuki et al. | |
| 8,674,485 B1 * | 3/2014 | Kim | H01L 23/49558 257/676 |
| 2006/0054901 A1 * | 3/2006 | Shoji | H01L 24/48 257/E33.059 |
| 2007/0090565 A1 * | 4/2007 | Ochi | H01L 21/561 425/572 |
| 2008/0020510 A1 * | 1/2008 | Kuratomi | H01L 21/565 257/E21.705 |
| 2008/0038873 A1 | 2/2008 | Tanida | |
| 2011/0081750 A1 * | 4/2011 | Machida | H01L 21/4842 438/123 |
| 2014/0349447 A1 * | 11/2014 | Fujii | H01L 21/561 438/123 |

FOREIGN PATENT DOCUMENTS

| | | |
|---|---|---|
| DE | 10 2007 034 247 A1 | 2/2008 |
| JP | S48-38070 A | 6/1973 |
| JP | S63-170962 U | 11/1988 |
| JP | H09-205698 A | 8/1997 |
| JP | 2002-067072 A | 3/2002 |
| JP | 2007-128930 A | 5/2007 |
| JP | 2007-324149 A | 12/2007 |

OTHER PUBLICATIONS

An Office Action mailed by the Korean Intellectual Property Office dated Nov. 21, 2018, which corresponds to Korean Patent Application No. 10-2017-7008409 and is related to U.S. Appl. No. 15/322,191.

An Office Action mailed by The State Intellectual Property Office of the People's Republic of China dated Jul. 20, 2018, which corresponds to Chinese Patent Application No. 201480082449.5 and is related to U.S. Appl. No. 15/322,191.

Notification of Transmittal of Translation of the International Preliminary Report on Patentability (Chapter I) and Translation of Written Opinion of the International Searching Authority; PCT/JP2014/076571; dated Apr. 13, 2017.

International Search Report issued in PCT/JP2014/076571; dated Jan. 6, 2015.

* cited by examiner

FIG.15

METHOD FOR MANUFACTURING SEMICONDUCTOR DEVICE

CROSS-REFERENCE TO RELATED APPLICATIONS

This application is a Divisional of U.S. patent application Ser. No. 15/322,191 filed Dec. 27, 2016, which was the U.S. National Stage of International Application No. PCT/JP2014/076571 filed Oct. 3, 2014, the entire content of which is incorporated herein by reference.

TECHNICAL FIELD

This invention relates to a lead frame and a method for manufacturing a semiconductor device including the lead frame.

BACKGROUND

Patent Document 1 discloses a technique in which after a lead frame is encapsulated in resin, unnecessary resin is pushed with a break pin to be removed.

PRIOR ART

Patent Literature

Patent Literature 1: Japanese Patent Laid-Open No. 2007-128930

SUMMARY

Technical Problem

A runner which is part of unnecessary resin is pushed with a runner pushing pin to flick away the runner. The flicking away of the runner is preferably performed in a state in which part of a tie bar is held with a holding jig. For fixing a tie bar in place with a holding jig, a large tie bar width is desirable.

Meanwhile, a tie bar is a portion which is cut before product completion. Accordingly, for easily cutting a tie bar, a small tie bar width is desirable. Thus, there has been a problem that reducing a tie bar width makes it difficult to fix the tie bar in place with a holding jig and increasing a tie bar width makes it impossible to easily cut the tie bar.

The present invention has been accomplished to solve the above-described problem, and an object of the present invention is to provide a lead frame including a tie bar which can easily be held with a holding jig and cut and a method for manufacturing a semiconductor device using the lead frame.

Means for Solving the Problems

A lead frame according to the invention of the present application includes a first lead terminal, a second lead terminal provided parallel to the first lead terminal, and a tie bar connecting the first lead terminal and the second lead terminal, wherein the tie bar includes a first narrow-width section touching the first lead terminal, a second narrow-width section touching the second lead terminal, a wide-width section having a larger width than the first narrow-width section and the second narrow-width section and connecting the first narrow-width section and the second narrow-width section, and the wide-width section has a through-hole formed between the first narrow-width section and the second narrow-width section.

A method for manufacturing a semiconductor device according to the invention of the present application includes the steps of fixing a semiconductor device to a lead frame includes a first lead terminal, a second lead terminal, and a tie bar connecting the first lead terminal and the second lead terminal, the tie bar includes a first narrow-width section touching the first lead terminal, a second narrow-width section touching the second lead terminal, and a wide-width section having a larger width than the first narrow-width section and the second narrow-width section and connecting the first narrow-width section and the second narrow-width section, performing transfer molding to form resin covering the semiconductor device using a runner channel provided along the tie bar, performing removal by fixing any one of an upper end portion and a lower end portion of the wide-width section of the tie bar with a holding jig and inserting a runner pushing pin into a through-hole provided between the first narrow-width section and the second narrow-width section in the wide-width section to flick away a runner adhering to the tie bar, and cutting the first narrow-width section and the second narrow-width section.

Other features of the present invention will be revealed below.

Advantageous Effects of Invention

In this invention, a tie bar has a large width portion and a small width portion. Accordingly, the tie bar can easily be held with a holding jig, and the tie bar can easily be cut.

BRIEF DESCRIPTION OF THE DRAWINGS

FIG. 4 is a plan view of resin and the like.

DESCRIPTION OF EMBODIMENTS

Lead frames and semiconductor device manufacturing methods according to embodiments of the present invention will be described with reference to the drawings. The same or corresponding components will be denoted by the same reference signs, and the repetition of explanation thereof may be omitted.

Embodiment 1

Figure 1:
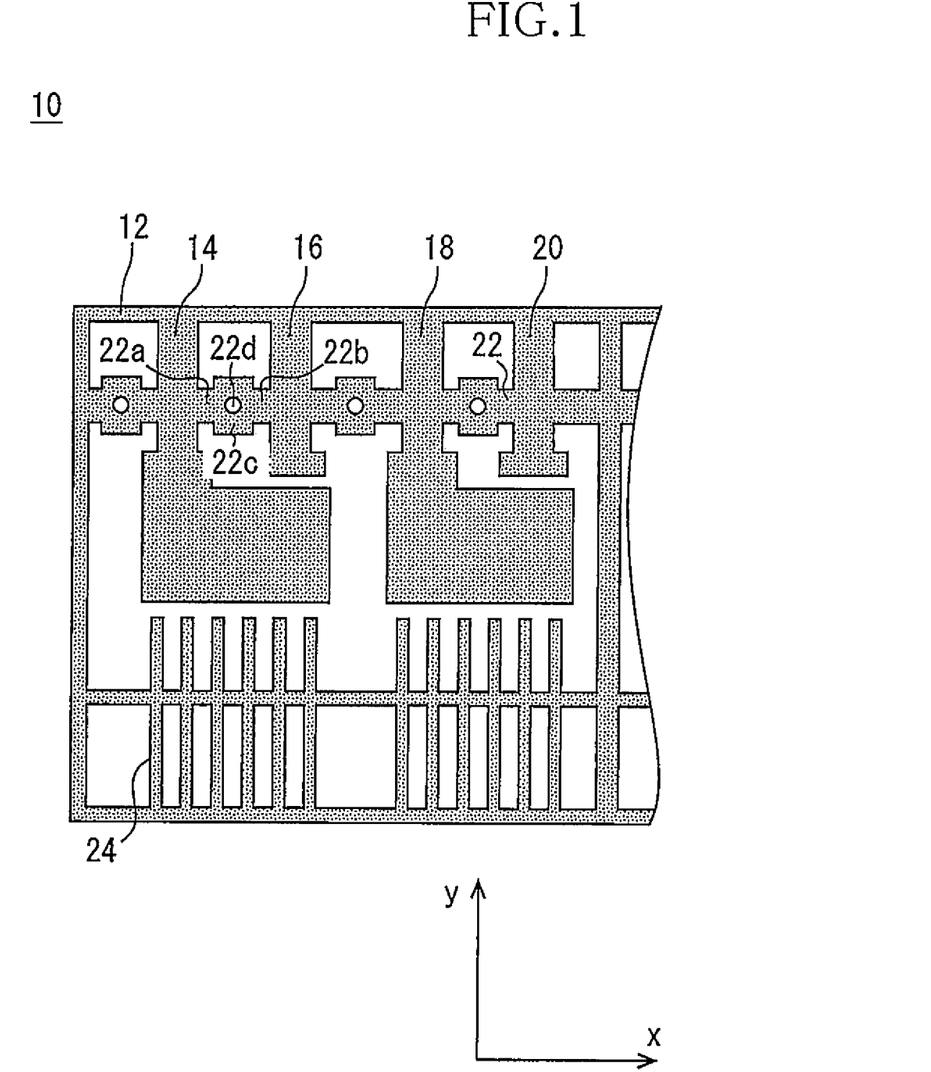
FIG. 1 is a plan view of a lead frame according to Embodiment 1.

FIG. 1 is a plan view of a lead frame 10 according to Embodiment 1 of the present invention. The lead frame 10 includes an outer frame 12. The outer frame 12 has a first lead terminal 14, a second lead terminal 16, a third lead terminal 18, and a fourth lead terminal 20 connected thereto. These lead terminals are provided parallel to each other.

The outer frame 12 and the first lead terminal 14, the first lead terminal 14 and the second lead terminal 16, the second lead terminal 16 and the third lead terminal 18, and the third lead terminal 18 and the fourth lead terminal 20 are connected with a tie bar 22. The tie bar 22 includes a first narrow-width section 22a, a second narrow-width section 22b, and a wide-width section 22c. The first narrow-width section 22a touches the first lead terminal 14. The second narrow-width section 22b touches the second lead terminal 16. The wide-width section 22c connects the first narrow-width section 22a and the second narrow-width section 22b.

The wide-width section 22c has a larger width than the first narrow-width section 22a and the second narrow-width section 22b. In other words, the wide-width section 22c extends upward (in a positive y direction) and downward (in a negative y direction) longer than the first narrow-width section 22a and the second narrow-width section 22b. The wide-width section 22c has a through-hole 22d formed between the first narrow-width section 22a and the second narrow-width section 22b.

Figure 2:
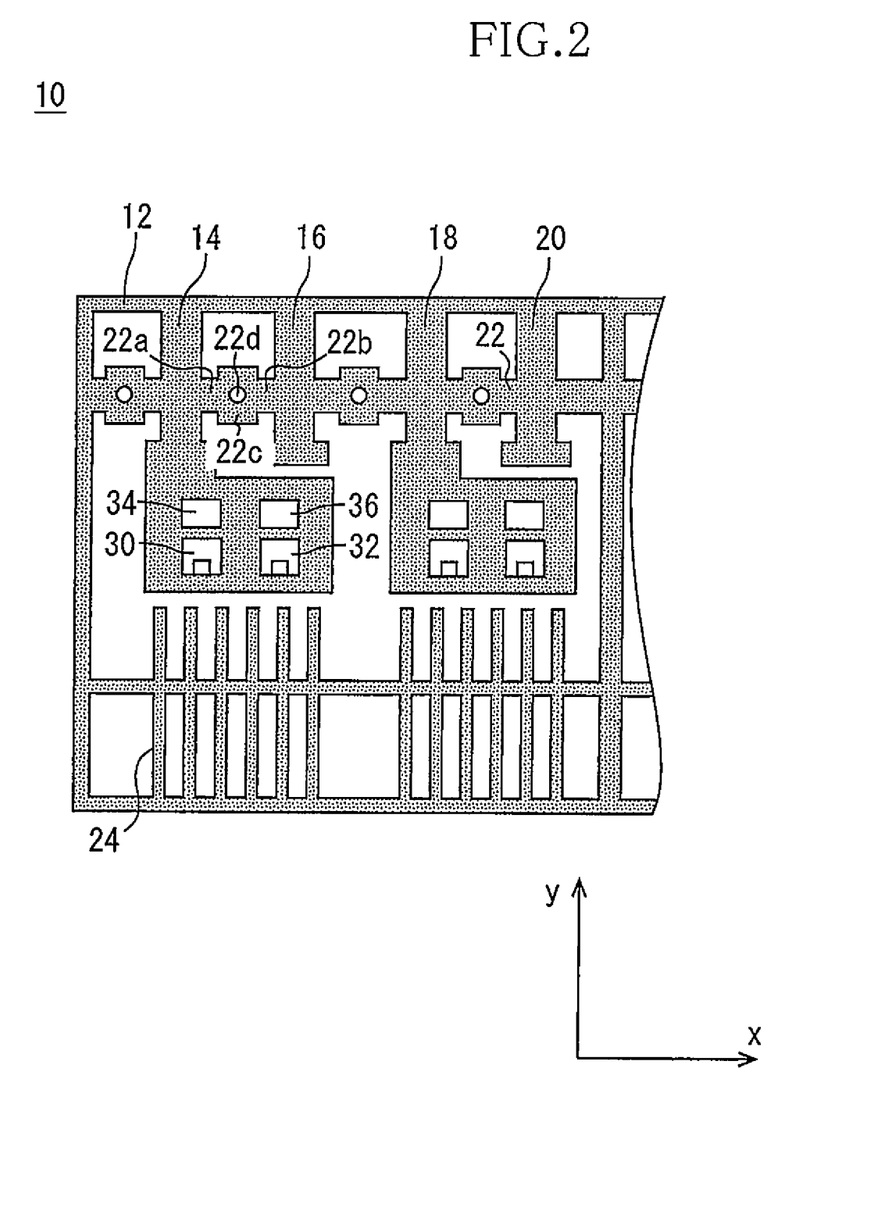
FIG. 2 is a plan view showing the lead frame and the semiconductor devices.

A semiconductor device manufacturing method according to Embodiment 1 of the present invention will be described. First, semiconductor devices are fixed to the lead frame. FIG. 2 is a plan view showing the lead frame and the semiconductor devices. Each of the semiconductor devices 30 and 32 is an IGBT (Insulated Gate Bipolar transistor) chip having an emitter and a base on a front surface thereof and a collector on a back surface thereof. Each of the semiconductor devices 34 and 36 is a diode having an anode on a front surface thereof and a cathode on a back surface thereof. The collectors of the semiconductor devices 30 and 32 and the cathodes of the semiconductor devices 34 and 36 are fixed to a die pad portion of the first lead terminal 14 with solder. Similarly, semiconductor devices are fixed to a die pad portion of the third lead terminal 18.

Figure 3:
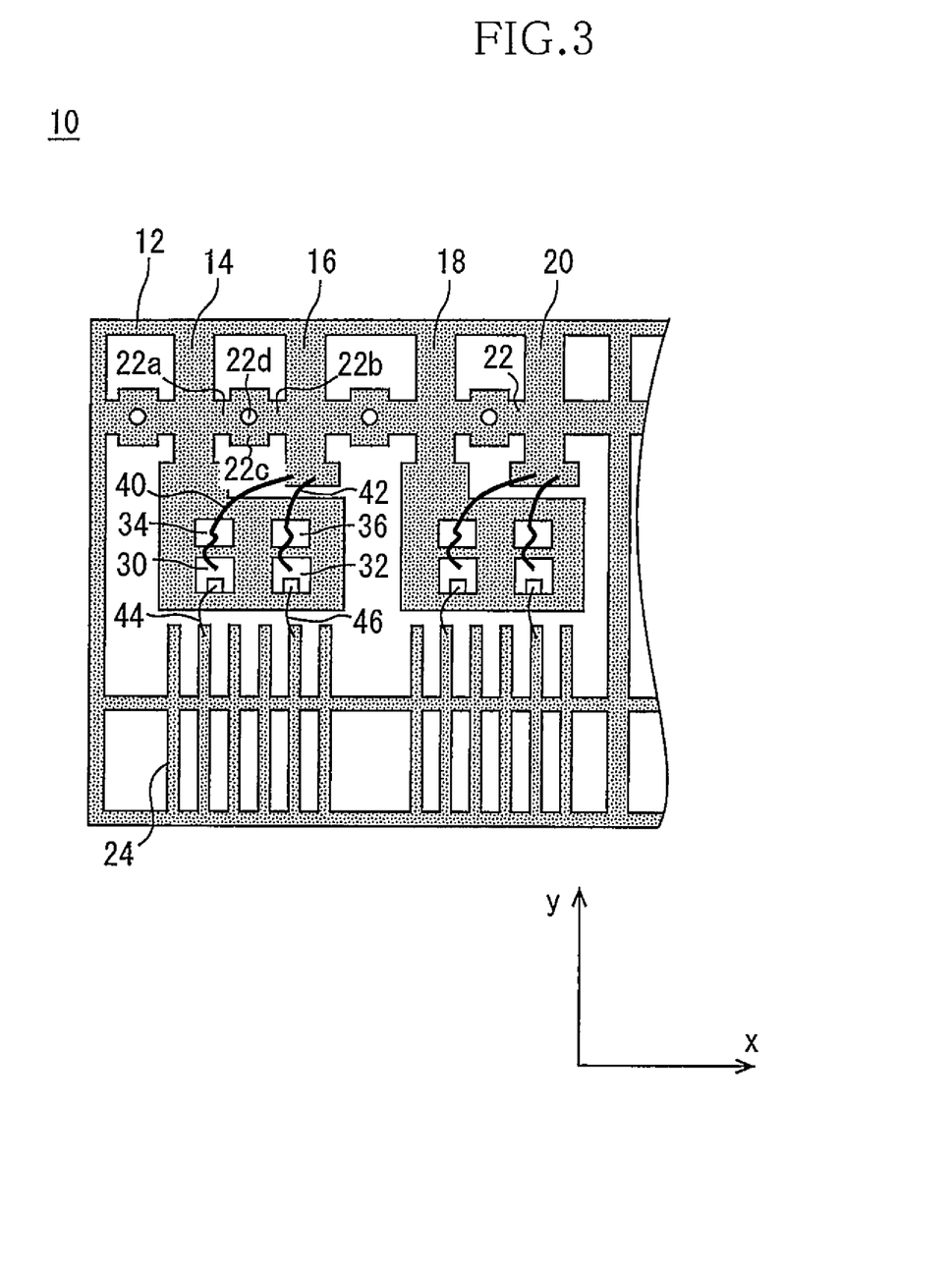
FIG. 3 is a plan view of a semiconductor device after wire connection making.

Then, necessary wire connection is made. FIG. 3 is a plan view of a semiconductor device after wire connection making A wire 40 connects the emitter of the semiconductor device 30 and the anode of the semiconductor device 34 to the second lead terminal 16. A wire 42 connects the emitter of the semiconductor device 32 and the anode of the semiconductor device 36 to the second lead terminal 16. A wire 44 connects a gate of the semiconductor device 30 and a control terminal 24. A wire 46 connects a gate of the semiconductor device 32 and a control terminal 24. Thus, the semiconductor devices and part of the lead frame are connected with wires. It should be noted that a heat spreader is joined to the lead frame with solder if necessary.

Figure 4:
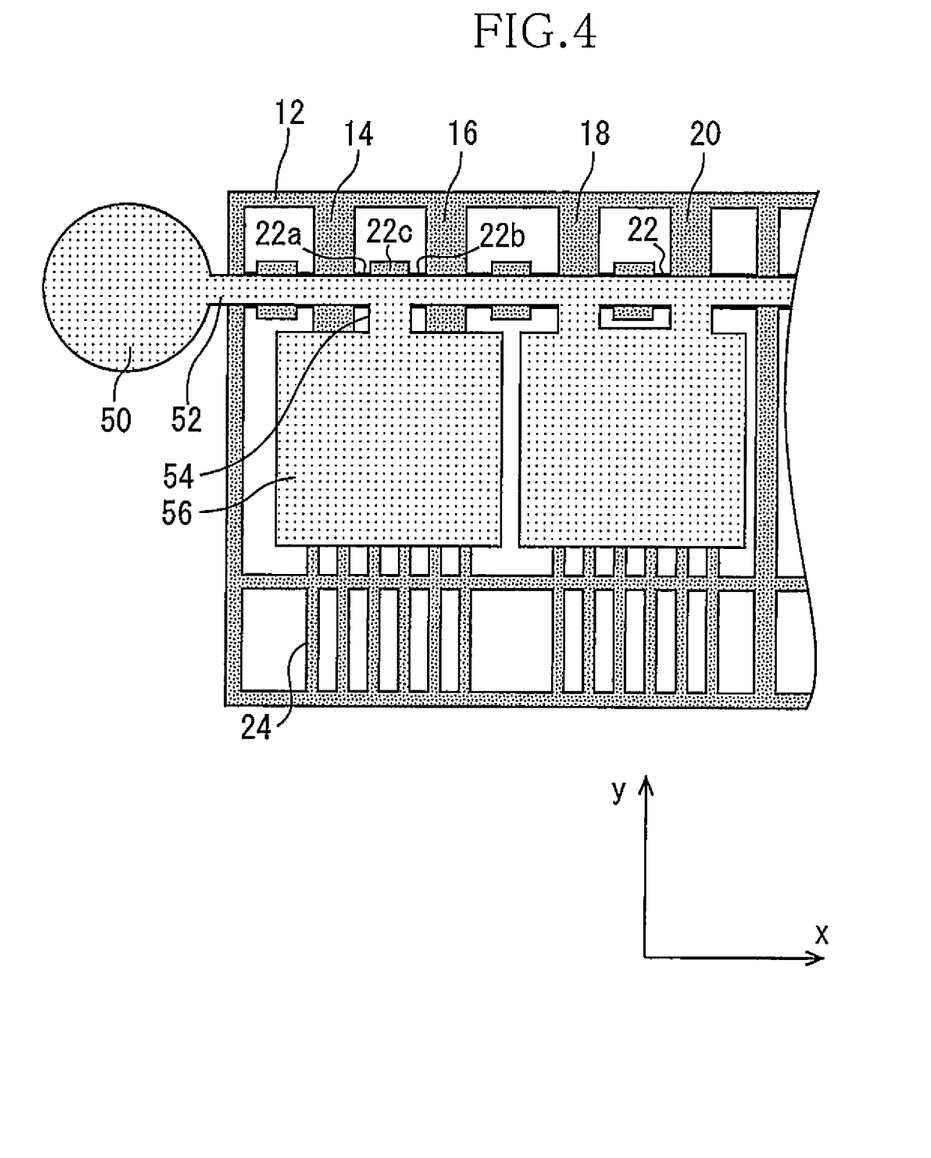

Subsequently, a transfer molding step is performed. In the transfer molding step, a plurality of molded parts are produced with a single mold. This molding method is called a side runner gate method. FIG. 4 is a plan view of resin and the like formed by the transfer molding step. In the transfer molding step, the lead frame is set in cavities of the mold, and the mold is clamped. Then, resin passed through a pot portion (place where cull 50 is located), a runner channel over the tie bar 22, and gate channels is charged into the cavities. After that, the resin is cured, the mold is opened, and the molded parts as a structure in which the lead frame and the resin are integrated are taken out of the mold. The resin includes cull 50, a runner 52, gates 54, and packages 56. The runner 52 is provided on the tie bar 22 along the tie bar 22. The runner 52 fills the through-holes 22d of the wide-width sections 22c but does not cover upper end portions and lower end portions of the wide-width sections 22c. In other words, the upper end portions of the wide-width sections 22c are exposed on the runner 52 in the positive y direction, and the lower end portions of the wide-width sections 22c are exposed on the runner 52 in the negative y direction. The packages 56 are portions for covering and protecting the semiconductor devices.

Figure 5:
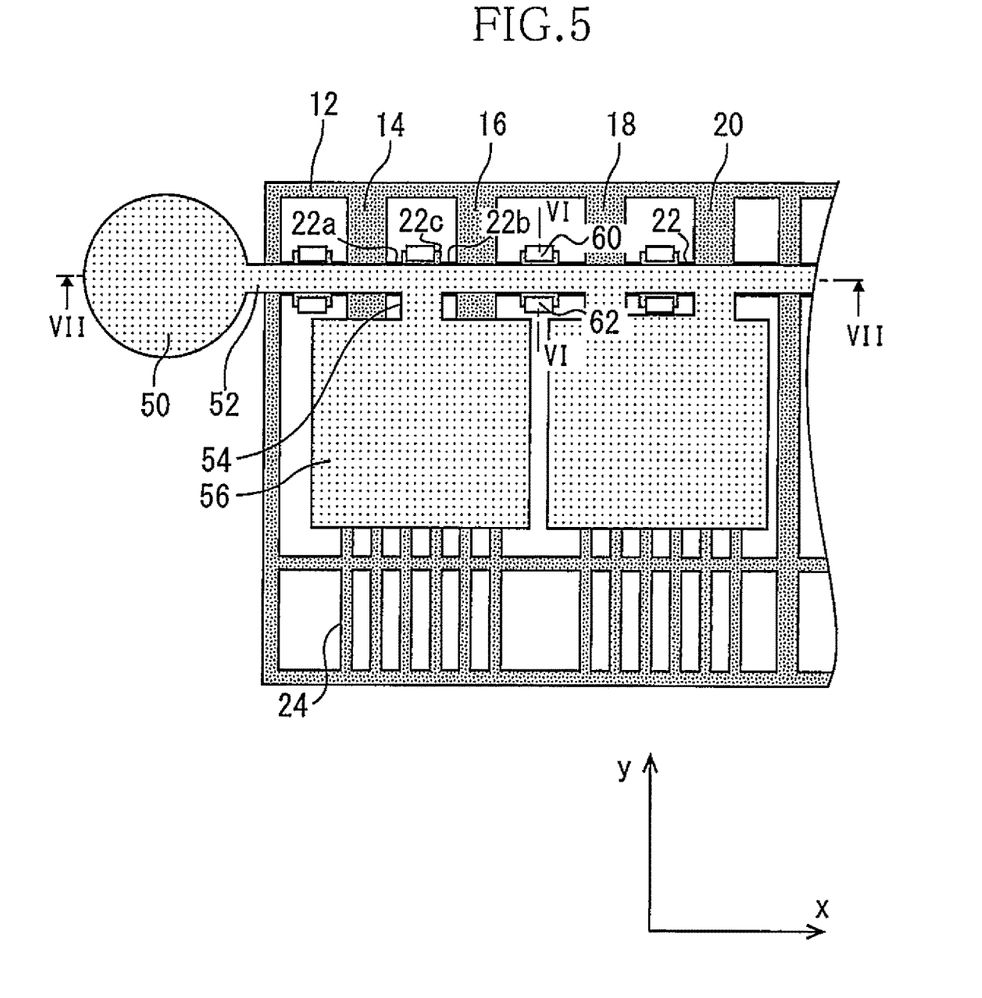
FIG. 5 is a plan view of the lead frame and the like in the removal step.

Then, a removal step is performed. The removal step is a step of flicking away the runner 52 adhering to the tie bar 22. FIG. 5 is a plan view of the lead frame and the like in the removal step. In the removal step, first, the upper end portions of the wide-width sections 22c of the tie bar 22 are fixed in place with holding jigs 60, and the lower end portions of the wide-width sections 22c are fixed in place with holding jigs 62.

Figure 6:
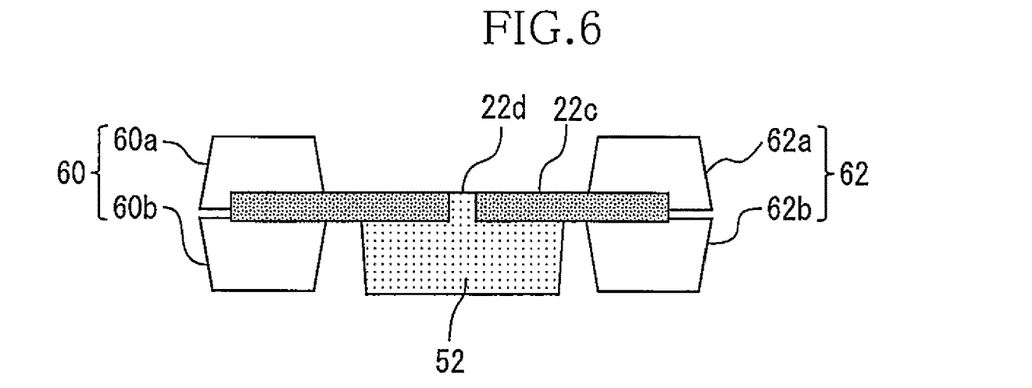
FIG. 6 is a cross-sectional view taken along dashed line VI-VI of FIG. 5.

FIG. 6 is a cross-sectional view taken along dashed line VI-VI of FIG. 5. The holding jig 60 includes an upper portion 60a and a lower portion 60b. The upper portion 60a touches an upper surface of the upper end portion of the wide-width section 22c, and the lower portion 60b touches a lower surface of the upper end portion of the wide-width section 22c. The upper end portion of the wide-width section 22c is fixed in place by reducing the distance between the upper portion 60a and the lower portion 60b. The holding jig 62 includes an upper portion 62a and a lower portion 62b. The upper portion 62a touches an upper surface of the lower end portion of the wide-width section 22c, and the lower portion 62b touches a lower surface of the lower end portion of the wide-width section 22c. The lower end portion of the wide-width section 22c is fixed in place by reducing the distance between the upper portion 62a and the lower portion 62b.

Figure 7:
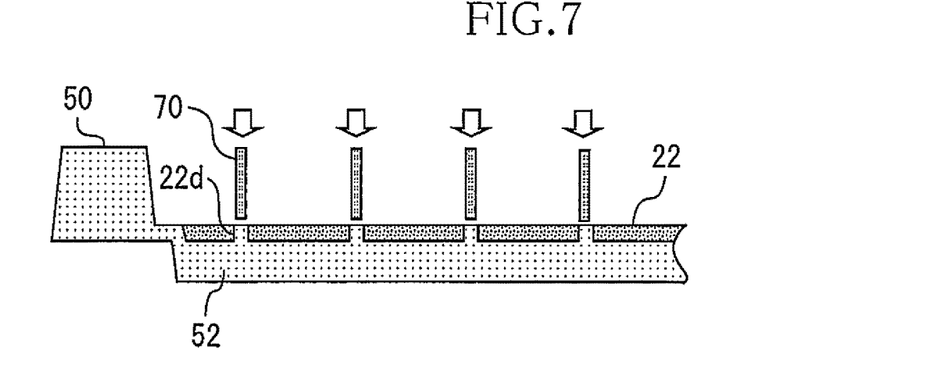
FIG. 7 is a cross-sectional view taken along dashed line VII-VII of FIG. 5.

In a state in which the upper end portion and the lower end portion of the wide-width section 22c are fixed in place with the holding jigs 60 and 62 as described above, the runner 52 is flicked away. FIG. 7 is a cross-sectional view taken along dashed line VII-VII of FIG. 5. The runner 52 is flicked away by inserting runner pushing pins 70 into the through-holes 22d provided in the wide-width sections 22c. In other words, the runner 52 is flicked away by pushing the resin formed in the through-holes 22d with the runner pushing pins 70. To flick away the runner 52 with the runner pushing pins 70, part of the resin of the runner 52 must be formed in the through-holes 22d. Thus, the runner 52 is separated from the tie bar 22.

Figure 8:
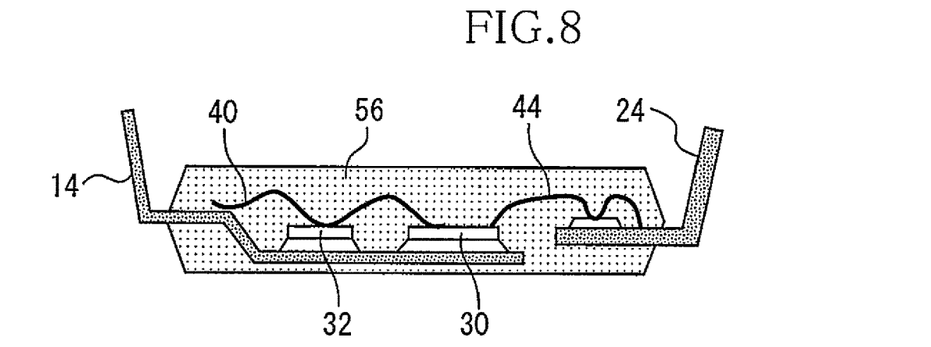
FIG. 8 is a cross-sectional view of a semiconductor device manufactured by the semiconductor device manufacturing method according to Embodiment 1.

Subsequently, a heating step is performed to completely cure the packages 56. Then, the first narrow-width sections 22a and the second narrow-width sections 22b of the tie bar 22 are cut. Further, unnecessary portions of the lead frame 10, such as the outer frame 12, are cut off. After that, lead terminal shaping, product test, and the like are performed to complete semiconductor devices. FIG. 8 is a cross-sectional view of a semiconductor device manufactured by the semiconductor device manufacturing method according to Embodiment 1 of the present invention. A plurality of semiconductor devices such as shown in FIG. 8 are formed by performing the above-described steps.

The tie bar 22 of the lead frame 10 according to Embodiment 1 has the first narrow-width sections 22a, the second narrow-width sections 22b, and the wide-width sections 22c. In the removal step, the upper end portions and the lower end portions of each wide-width sections 22c are fixed in place with the holding jigs 60 and 62. Since the wide-width sections 22c have larger widths than the first narrow-width sections 22a and the second narrow-width sections 22b, the wide-width sections 22c can easily be fixed in place with the holding jigs 60 and 62. Fixing the wide-width sections 22c in place enables forces of the runner pushing pins 70 to be efficiently exerted on the runner 52 and enables the runner 52 to be reliably removed.

Moreover, when the tie bar 22 is cut, the first narrow-width sections 22a and the second narrow-width sections 22b having smaller widths than the wide-width sections 22c are cut. Accordingly, clamping pressure can be reduced at the time of tie bar cutting, or the number of times of clamping can be reduced. In other words, the tie bar 22 can easily be cut.

Although both the upper end portion and the lower end portion of each wide-width section 22c are fixed in place with the holding jigs 60 and 62 in the above-described removal step, it is also possible to fix any one of the upper end portion and the lower end portion in place. Moreover, any one of the upper end portion and the lower end portion of the wide-width section may be omitted. For example, in FIG. 1, the y coordinate of a lower end of the wide-width section may be made equal to the y coordinates of lower ends of the first narrow-width section 22a and the second narrow-width section 22b, with an upper end of the wide-width section extended in the positive y direction longer than upper ends of the first narrow-width section 22a and the second narrow-width section 22b. In this case, the upper end portion of the wide-width section is fixed in place with a holding jig. An insulating sheet may be provided on a back-surface side of the semiconductor devices. Devices other than IGBTs and diodes may be used as the semiconductor devices.

These modifications can also be applied to lead frames and semiconductor device manufacturing methods according to embodiments below. It should be noted that the lead frames and the semiconductor device manufacturing methods according to the embodiments below have many things in common with those of Embodiment 1, and therefore differences from Embodiment 1 will be mainly described.

Embodiment 2

Figure 9:
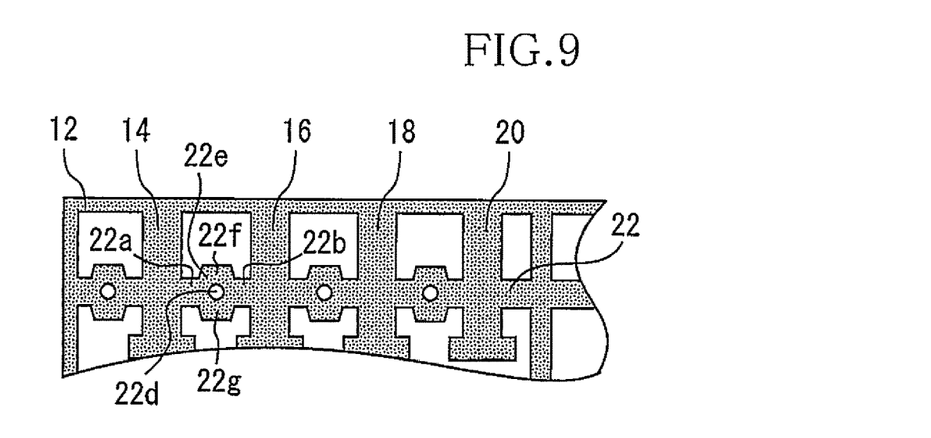
FIG. 9 is a partial plan view of a lead frame according to Embodiment 2.

FIG. 9 is a partial plan view of a lead frame according to Embodiment 2. Each wide-width section 22e includes a trapezoidal portion 22f (upper end portion) which is convex upward in planar view and a trapezoidal portion 22g (lower end portion) which is convex downward in planar view. The lead frame is produced by performing punch pressing on a metal plate using punching dies. It is preferred that the clamping pressure of the punching dies on the lead frame is small. For this reason, trapezoidal portions 22f and 22g are provided in the wide-width section 22e. This makes it possible to make the clamping pressure of the punching dies smaller than in the case where a rectangular wide-width section is formed.

Figure 10:
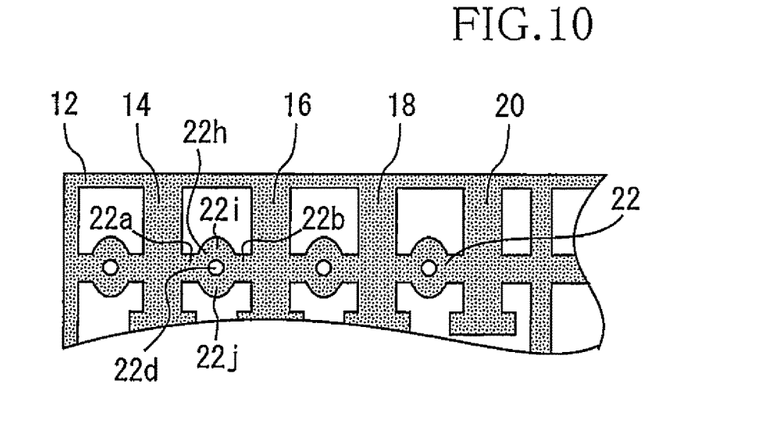
FIG. 10 is a partial plan view of a lead frame according to a modified example.

FIG. 10 is a partial plan view of a lead frame according to a modified example. An upper end portion 22i and a lower end portion 22j of each wide-width section 22h are formed in semicircular shapes in planar view. Thus, the outer edge of the wide-width section 22h is a curved line. The curved outer edge of the wide-width section makes it possible to make the clamping pressure of the punching dies small.

Embodiment 3

Figure 11:
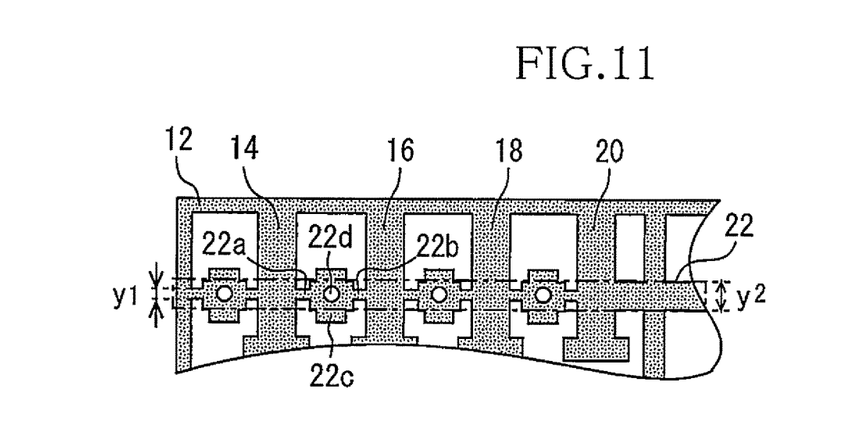
FIG. 11 is a partial plan view of a lead frame and the like according to Embodiment 3.

FIG. 11 is a partial plan view of a lead frame and the like according to Embodiment 3. A region in which a runner is formed is indicated by dashed dotted lines. The widths (y1) of the first narrow-width section 22a and the second narrow-width section 22b are smaller than the width (y2) of the runner. Accordingly, clamping pressure at the time of tie bar cutting can be reduced, or the number of times of clamping can be reduced. Moreover, setting the width (y2) of the runner larger than the widths (y1) of the first narrow-width section 22a and the second narrow-width section 22b allows a runner channel to have a sufficient width.

Embodiment 4

Figure 12:
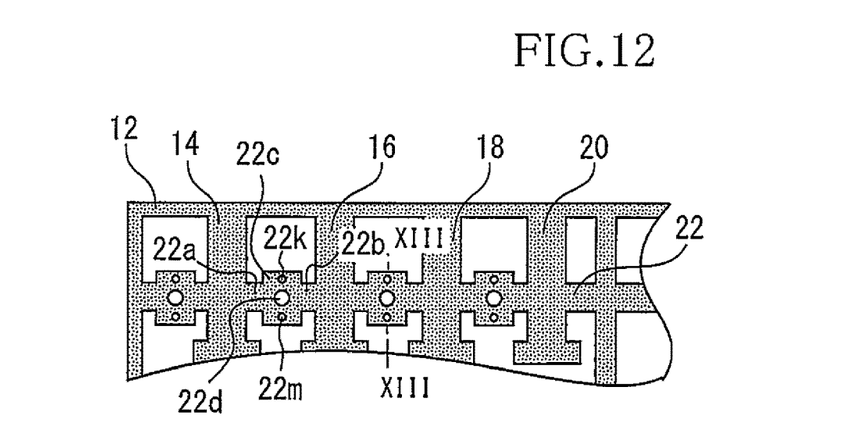
FIG. 12 is a partial plan view of a lead frame according to Embodiment 4.

FIG. 12 is a partial plan view of a lead frame according to Embodiment 4. An upper end through-hole 22k is formed on an upper-end side of each wide-width section 22c, and a lower end through-hole 22m is formed on a lower-end side of the wide-width section 22c. The through-hole 22d is located at a position between the upper end through-hole 22k and the lower end through-hole 22m.

Figure 13:
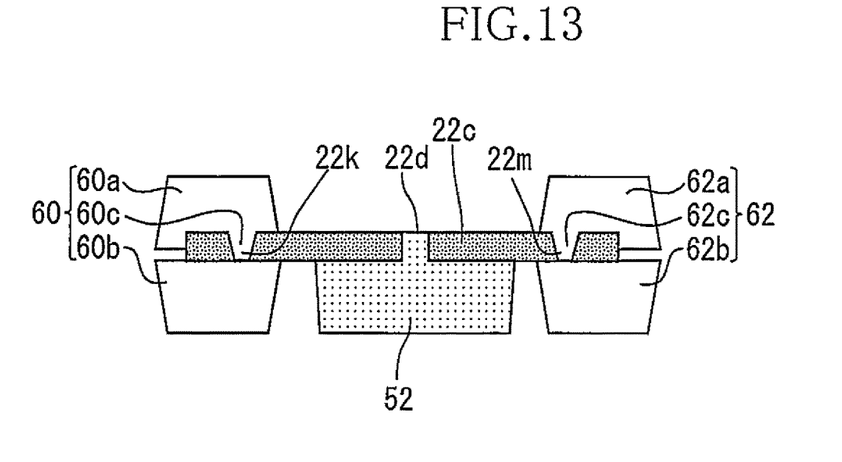
FIG. 13 is a cross-sectional view of holding jigs and the like in the removal step.

FIG. 13 is a cross-sectional view of holding jigs and the like in the removal step. The wide-width section 22c of the tie bar shown in FIG. 13 is the wide-width section located at line XIII-XIII of FIG. 12. The holding jig 60 has a protruding portion 60c formed integrally with the upper portion 60a, and the holding jig 62 has a protruding portion 62c formed integrally with the upper portion 62a. In the removal step, the protruding portion 60c is inserted into the upper end through-hole 22k, and the protruding portion 62c is inserted into the lower end through-hole 22m. This ensures that the lead frame is placed at a predetermined position. Accordingly, the runner pushing pins can be reliably passed through the through-holes 22d.

The protruding portions 60c and 62c inserted in the upper end through-hole 22k and the lower end through-hole 22m reduce a lateral displacement of the lead frame. Accordingly, the lead frame can be prevented from being displaced and lifted due to the molding shrinkage of the runner 52. Further, since the upper end through-hole 22k and the lower end through-hole 22m are provided in part of the tie bar 22, the protruding portions 60c and 62c inserted therein are located close to the runner 52. Accordingly, the displacement of the lead frame can be sufficiently reduced. It is also possible to provide only any one of the upper end through-hole and the lower end through-hole.

Embodiment 5

Figure 14:
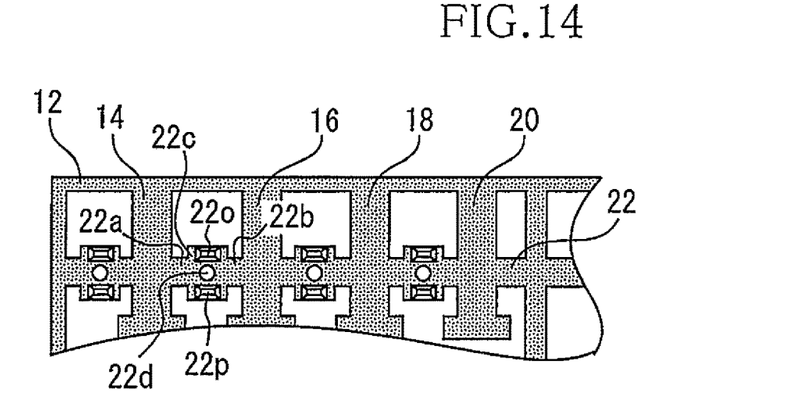
FIG. 14 is a partial plan view of a lead frame according to Embodiment 5.

FIG. 14 is a partial plan view of a lead frame according to Embodiment 5. An upper end recessed portion 22o is formed on the upper-end side of each wide-width section 22c, and a lower end recessed portion 22p is formed on the lower-end side of the wide-width section 22c. The through-hole 22d is located at a position between the upper end recessed portion 22o in the upper end portion of the wide-width section 22c and the lower end recessed portion 22p in the lower end portion of the wide-width section 22c.

Figure 15:
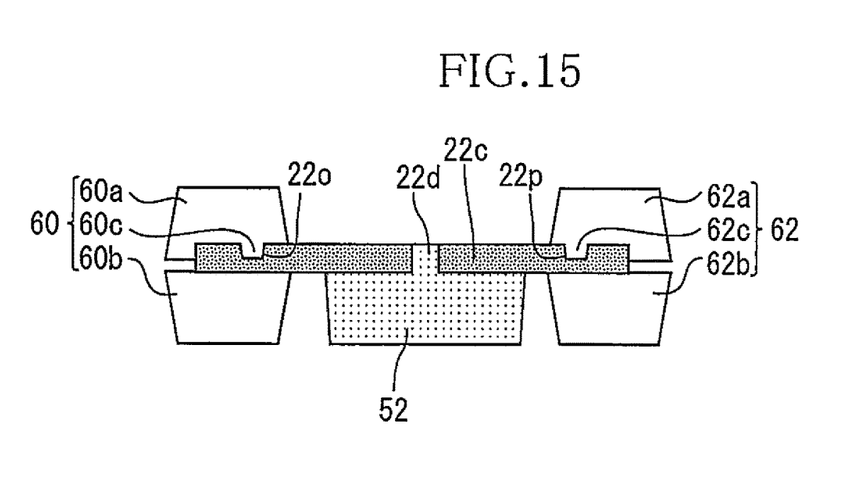
FIG. 15 is a cross-sectional view of holding jigs and the like in the removal step.

FIG. 15 is a cross-sectional view of holding jigs and the like in the removal step. The holding jigs 60 and 62 have the protruding portions 60c and 62c, respectively. In the removal step, the protruding portion 60c is inserted into the upper end recessed portion 22o, and the protruding portion 62c is inserted into the lower end recessed portion 22p. This ensures that the lead frame is placed at a predetermined position. Further, since the protruding portions 60c and 62c are pressed against the wide-width section 22c, the effect of preventing the lead frame from being lifted can be improved.

It should be noted that features of the lead frames and the semiconductor device manufacturing methods according to the above-described embodiments may be appropriately combined.

DESCRIPTION OF SYMBOLS

10 lead frame, 12 outer frame, 14 first lead terminal, 16 second lead terminal, 18 third lead terminal, 20 forth lead terminal, 22 tie bar, 22a first narrow-width section, 22b second narrow-width section, 22c wide-width section, 22d through-hole, 22k upper end through-hole, 22m lower end through-hole, 22o upper end recessed portion, 22p lower end recessed portion, 24 control terminal, 30,32,34,36 semiconductor devices, 50 cull, 52 runner, 54 gates, 56 packages, 60,62 holding jigs, 70 runner pushing pins

The invention claimed is:

1. A method for manufacturing a semiconductor device, comprising the steps of:
    fixing a semiconductor device to a lead frame comprising a first lead terminal, a second lead terminal, and a tie bar connecting the first lead terminal and the second lead terminal, the tie bar comprising a first narrow-width section touching the first lead terminal, a second narrow-width section touching the second lead terminal, and a wide-width section having a larger width than the first narrow-width section and the second narrow-width section and connecting the first narrow-width section and the second narrow-width section;
    performing transfer molding to form resin covering the semiconductor device using a runner channel provided along the tie bar;
    performing removal by fixing any one of an upper end portion and a lower end portion of the wide-width section of the tie bar with a holding jig and inserting a runner pushing pin into a through-hole provided between the first narrow-width section and the second narrow-width section in the wide-width section to flick away a runner adhering to the tie bar; and
    cutting the first narrow-width section and the second narrow-width section.

2. The method according to claim 1, wherein the first narrow-width section and the second narrow-width section have smaller widths than the runner.

3. The method according to claim 1, wherein
    the wide-width section has any one of an upper end through-hole provided in the upper end portion and a lower end through-hole provided in the lower end portion, and
    the holding jig has a protruding portion, and, in the removal step, the protruding portion is inserted into the any one of the upper end through-hole and the lower end through-hole to ensure that the lead frame is placed at a predetermined position.

4. The method according to claim 1, wherein
    the wide-width section has any one of an upper end recessed portion provided in the upper end portion and a lower end recessed portion provided in the lower end portion, and
    the holding jig has a protruding portion, and, in the removal step, the protruding portion is inserted into the any one of the upper end recessed portion and the lower end recessed portion to ensure that the lead frame is placed at a predetermined position.

* * * * *